Aug. 4, 1964 J. MASERJIAN 3,143,443

METHOD OF FABRICATING SEMICONDUCTOR DEVICES

Filed May 1, 1959

INVENTOR.
JOSEPH MASERJIAN,
BY John M. Koch
ATTORNEY.

United States Patent Office 3,143,443
Patented Aug. 4, 1964

3,143,443

METHOD OF FABRICATING SEMICONDUCTOR DEVICES

Joseph Maserjian, Newport Beach, Calif., assignor to Hughes Aircraft Company, Culver City, Calif., a corporation of Delaware Filed May 1, 1959, Ser. No. 810,366
5 Claims. (Cl. 148—178)

This invention relates to a method of fabricating semiconductor devices, such as diodes and transistors, particularly variable capacitance diodes for parametric amplification and fast recovery diodes with high forward conductance and semiconductor base regions used as an intermediate stage in producing transistors.

Prior art methods of fabricating such diodes and transistors involve machining and etching a doped semiconductor crystal to a very thin dimension, then performing an alloying or diffusing operation to produce a heavily doped region of opposite type in the crystal. This results in the formation of intermediate depths in the crystal and a thin region of high resistivity. Such methods involve critical operations with necessarily low yields and, in general, are not capable of reaching limits which can be attained by using this invention.

Accordingly, an important object of this invention is to produce in a semiconductor device a thin, lightly doped semiconductor region adjacent a heavily doped semiconductor region.

Another object of this invention is to produce a diode or transistor incorporating a very thin, lightly doped, semiconductor region of high resistivity adjacent a heavily doped, thicker semiconductor region. Such a configuration in the semiconductor is very useful in fabricating the devices to which this invention relates.

Additional objects will become apparent from the following description which is given primarily for purposes of illustration and not limitation.

Stated in general terms, the objects of my invention are attained by fabricating a diode or semiconductor base region as follows. A layer of doping material, such as aluminum, is deposited on one surface of a semiconductor crystal, such as a slice of a crystal of donor type silicon. This preferably is done by an evaporation-fusion method during which a slice of a silicon crystal is heated to a controlled maximum temperature, preferably above the aluminum-silicon eutectic temperature, while the layer of aluminum is being evaporated thereon. The resulting structure is heated to a higher controlled maximum temperature and held there until equilibrium conditions are approached. This usually requires only a short time, of the order of several minutes.

The resulting, hot structure then is slowly cooled to ambient temperature. A doped regrowth region of acceptor type is formed during this operation, in the preferred embodiment, adjacent the donor type slice of silicon crystal and below a covering layer of aluminum-silicon eutectic alloy. The covering layer of eutectic is removed in any suitable manner. This can be conveniently accomplished by treating the structure with an aqueuos hydrochloric acid etch solution. This etch solution strips off all of the aluminum-silicon eutectic layer without attacking the silicon regrowth region.

The resulting structure, in the preferred embodiment, is subjected to an elevated temperature, in a mildly oxidizing atmosphere, and maintained at such elevated temperature for a predetermined period of time. The time and temperature determine the amount of aluminum that diffuses out of, or outdiffuses from, the regrowth region and, correspondingly, the final concentration of aluminum remaining in the regrowth region.

In the preferred embodiment, a low resistance contact layer is deposited on the surface of the silicon slice opposite that covered by the regrowth region, that is, on the surface of the donor type side of the slice. This may be accomplished, for example, by evaporation-fusion of gold doped with antimony. Similarly, a contact to the surface of the acceptor type out-diffused layer is deposited by a method, such as evaporation-fusion of gold doped with gallium, for example. Furthermore, this latter evaporated layer may be defined with the aid of a mask, used during deposition, as an intermediate step in establishing the final device structure. A plurality of such defined areas can be formed with the aid of a mask so that the resulting silicon slice can be diced to produce a plurality of diode units each having a defined area on one side thereof and a contact layer on the other side.

A more detailed description of the preferred embodiment of my invention is given with reference to the appended drawing wherein:

FIG. 1 is a partial sectional elevational view, drawn to a greatly enlarged scale, showing a slice of donor type silicon 10 on the upper surface of which has been formed a layer of acceptor type silicon regrowth region 11 covered by a layer of aluminum-silicon eutectic 12;

Figure 6:
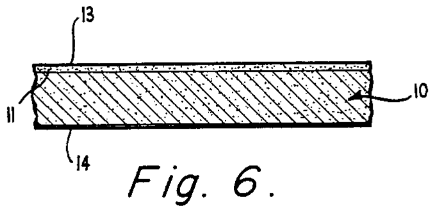
FIG. 6 is a view similar to that of FIG. 2, showing the addition of a gold-silicon eutectic layer 14 on the bottom surface of the silicon slice.
Figure 7:
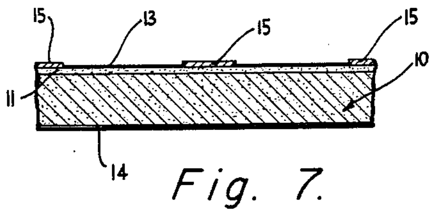
Figure 8:
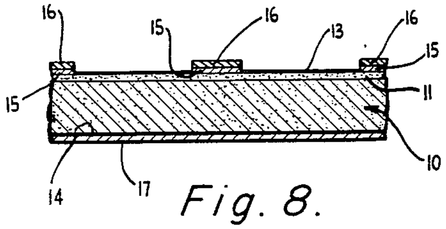
Figure 9:
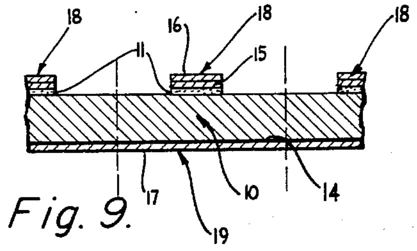

FIG. 7 is a view similar to that of FIG. 6, showing the formation of defined areas 15 of gold-silicon eutectic formed on the upper surface 11 of the silicon slice 10;

FIG. 8 is a view similar to that of FIG. 7, showing the addition of gold by electroplating layers 16 on the defined areas 15 of the upper surface of the silicon slice 10, and layer 17 on the lower area 14 of the silicon slice; and FIG. 9 is a view similar to that of FIG. 8, showing the formation of a completed diode by dicing the completed structure.

Figure 1:
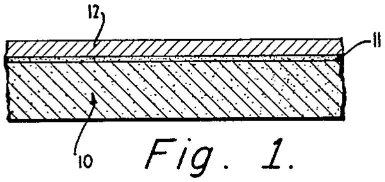

A slice of silicon 10 is cut from a grown crystal heavily doped with donor atoms, such as $10^{19}$ atoms of antimony per cm.$^3$. The thickness of the slice is about 6 mils. One side of the silicon slice 10 is polished or etched to produce a suitably clean surface upon which a layer of aluminum is evaporation-fused. The evaporation-fusion of the aluminum preferably is performed in a vacuum of about $2\times10^{-4}$ mm. Hg. An aluminum layer about 20 microns thick is deposited onto the prepared surface of the silicon slice 10, while maintaining a temperature above the aluminum-silicon eutectic, such as about 600° C., for example. The evaporation-fusion system is then heated to a maximum controlled temperature of about 670° C. and maintained at this maximum value for several minutes until nearly equilibrium conditions are established. The system then is slowly cooled to ambient temperature at a controlled rate of about 20° C. per minute. Under these conditions a regrowth region 11 (FIG. 1) is formed. This regrowth region is of the acceptor type, has a concentration of about $5\times10^{18}$ aluminum atoms/cm.$^3$ and is approximately 2 microns thick. A small amount of antimony also is present in the regrowth region 11 to a concentration less than about $10^{17}$ atoms/cm.$^3$. The regrowth region 11 is covered by a layer 12 of aluminum-silicon eutectic which should be removed from the structure.

Figure 3:
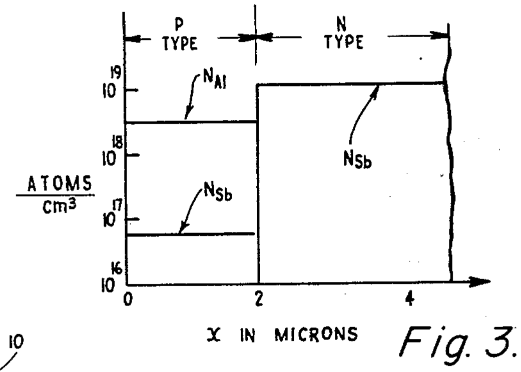
FIG. 3 is a diagram showing the concentration of donor or acceptor atoms per cubic centimeter versus distance in microns from the upper surface of the slice as shown in FIG. 2.
Figure 2:
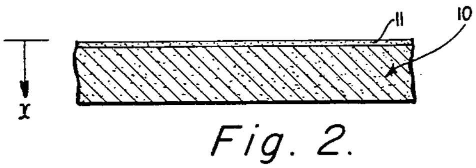
FIG. 2 is a similar view showing the slice of FIG. 1 as the aluminum-silicon eutectic layer has been removed to form a slice of donor silicon 10 covered on its upper surface with a layer of acceptor regrowth silicon 11.

To accomplish this, the resulting slice 10 is treated with an etching solution prepared by diluting concentrated hydrochloric acid (20 percent HCl by weight) with an equal volume of water. The etching solution removes the aluminum-silicon eutectic layer 12 and thus produces a slice as shown in FIG. 2. This etching solution does not attack the silicon but strips the eutectic layer 12 from all of the surfaces upon which the evaporation-fusion of aluminum occurred. FIG. 3 diagrammatically shows the concentration of donor or acceptor atoms per cubic centimeter versus distance in microns from the upper surface of the structure as shown in FIG. 2.

Figure 4:
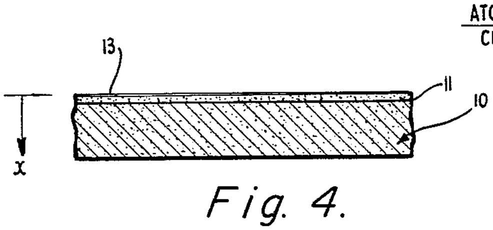
FIG. 4 is a view similar to that of FIG. 2 showing the formation of a thin skin 13 of donor layer over the acceptor regrowth layer 11 after the structure of FIG. 2 has been subjected to a diffusion temperature for a period of time.
Figure 5:
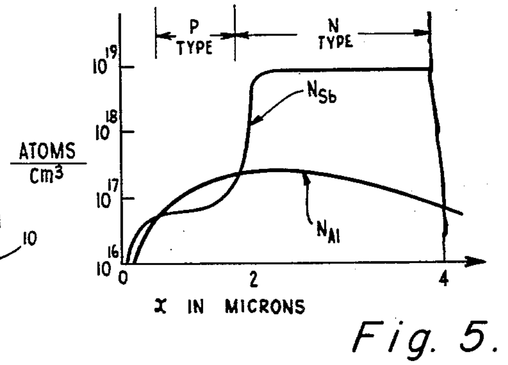
FIG. 5 is a diagram similar to that of FIG. 3, showing the concentration of donor and acceptor atoms versus transverse distance $x$ of the slice 10 after subjecting the slice to a diffusion temperature for a period of time.

The resulting structure is placed in a furnace in a mildly oxidizing atmosphere, such as one containing argon continuously bubbled through water at room temperature. It is heated in the furnace to a temperature of about 1200° C. for about one hour to cause aluminum to outdiffuse from the regrowth region 11 and produce the desired final residual concentration of aluminum in the regrowth region. A thin skin 13 of donor layer is formed over the acceptor regrowth region or layer 11, as indicated in FIG. 4. The temperature and time employed determine how much aluminum diffuses out of the regrowth region 11 and thus the residual concentration thereof. Under the instant conditions there remains an excess concentration of aluminum over antimony in the greater part of the regrowth region 11. FIG 5 is a diagram similar to that of FIG. 3 and shows the change in concentrations of donor and acceptor atoms brought about primarily by the diffusion of aluminum atoms from the regrowth region. It is also seen that the donor and acceptor concentration curves cross and recross each other in the regrowth region and show the formation of a thin donor skin at the upper surface of the structure shown in FIG. 4.

The resulting structure is provided with an evaporation-fused antimony-doped gold layer on the under side thereof. This operation is carried out in a vacuum while the structure is heated above 377° C. and preferably to a temperature of about 450° C. In this operation a low resistance contact 14 of gold-silicon eutectic is formed integrally with the donor region of the slice 10, as shown in FIG. 6.

A mask array (not shown) of small diameter holes is used to define metal deposition areas 15 (FIG. 7) which will eventually define junction areas. In the diode of this particular embodiment, a capacitance of the order of 1 $\mu\mu$f. is desired. Thus a diameter of approximately 2 mils is used in the holes in the mask. The mask employed is formed by a standard industrial process known to persons skilled in the art. Gallium-doped gold is evaporation-fused through the mask onto the acceptor type side of the specimen to form defined areas 15. The gold film thus deposited is made of sufficient thickness, preferably several microns, so that the defined areas 15 penetrate the thin skin 13 of donor region formed over the outer surface of the acceptor layer 11. The evaporation-fusion is again carried out at about 450° C. as described above in forming contact 14.

The gold surfaces formed on the structure up to this point are thickened, as shown at 16 and 17 in FIG. 8, by electroplating gold onto the evaporated gold areas 14 and 15. Thickening of the gold areas 14 and 15 in this manner serves to improve electrical contact and to protect the thin gold eutectic layers from subsequent etching. A thickness of several microns is sufficient for these purposes.

The resulting structure is subjected to a suitable known preferential chemical etch of a type which can be easily controlled to define junction areas 18, as shown in FIG. 9. A suitable etching solution for this purpose is prepared by mixing two volumes of concentrated nitric acid and one volume of concentrated hydrofluoric acid. Another method that can be employed for this purpose is electrolytic etching. In each case the etch should remove all of the unprotected acceptor layer 11 around the junction areas 18, but preferably should not remove an appreciable amount of donor silicon of slice 10 beneath the junction areas. The resulting etched structure is diced in a manner indicated by broken lines in FIG. 9 to form separate diode units, such as the unit between the broken lines. Each of the resulting units is appropriately surface-treated and, if desired, is encapsulated by using methods known in the art. Each of the units can be utilized in a desired circuit (not shown) by making an electrical connection to junction area 18 and a connection to junction area 19 by suitable bonding techniques or by the use of electrodes (not shown).

Alternatively to the above method for making a variable capacitance diode for parametric amplification, a diode suitable for fast recovery and high forward conductance, can be made as described above but modified with respect to the antimony doping of the silicon slice and the period of time employed for the outdiffusion operation. The original thin slice of silicon 10 is doped with antimony to a lower concentration of about $5\times10^{17}$ instead of $10^{19}$ atoms/cm.$^3$. The outdiffusion operation is carried out at 1200° C. for a longer period of time of 2 hours instead of 1 hour. This alternative procedure results in lower doping of excess aluminum in the acceptor region 11 and imparts the quality of larger reverse breakdown voltages to the diode structure produced. In the variable capacitance diode for parametric amplification, produced by the first method described above, only a few volts breakdown is required.

As a second alternative, either of the methods described above can be used as an intermediate stage in the production of a transistor. This is accomplished by adding a third semiconductor region to the structure formed by the methods described above. That structure is, of course, composed of a slice of a donor type silicon crystal and an outdiffused aluminum regrowth region. The third semiconductor region is formed onto the outdiffused regrowth region 11 to form an emitter and is a suitable heavily doped donor type semiconductor.

In both of the diodes described above, namely, the diode for parametric amplification and the diode characterized by high forward conductance, it is highly desirable that a very thin region of higher resistivity and opposite type than the thicker bulk be formed. The technique described in the method of my invention accomplishes this. Prior art methods have serious limitations. One method, for example, requires thinning down the parent slice 10 to a degree where it becomes impractical.

It will be understood that the method described above is given for the purpose of illustrating preferred embodiments of my invention but not for the purpose of limiting its scope. A person skilled in the art can vary or modify the method and the materials described above within the scope of the appended claims and without departing from the spirit of my invention.

What is claimed is:

1. In a method of fabricating a semiconductor device including a lightly doped semiconductor region adjacent a heavily doped semiconductor region, the improvement comprising forming an aluminum regrowth region on one surface of a heavily donor doped crystal of silicon and subjecting the resulting structure to an elevated temperature in a mildly oxidizing atmosphere to diffuse aluminum out of the regrowth region.

2. A method of fabricating a semiconductor device which comprises the steps of forming an aluminum regrowth region on one surface of a donor type crystal of silicon, subjecting the resulting structure to an elevated temperature in an oxidizing atmosphere to diffuse aluminum from the regrowth region into the silicon crystal, and forming contacts to the regrowth region and to the silicon crystal.

3. In a method of fabricating a semiconductor device including a lightly doped semiconductor region adjacent a heavily doped semiconductor region, the improvement comprising depositing a layer of aluminum onto a surface of a slice of a heavily donor doped crystal of silicon, subjecting the resulting structure to an elevated temperature, gradually reducing the temperature of the structure to room temperature to form a semiconductor regrowth region adjacent the surface of the silicon slice, removing any aluminum-silicon eutectic from the surface of the regrowth region, and subjecting the resulting structure to an elevated temperature in an oxidizing atmosphere to diffuse aluminum out of the regrowth region.

4. A method of fabricating a semiconductor device which comprises the steps of depositing by evaporation-fusion at about 600° C. a layer of aluminum about 20 microns thick onto a surface of a slice of silicon crystal about 6 mils thick doped with about $10^{19}$ atoms of antimony per cubic centimeter, subjecting the resulting structure to a temperature of about 670° C. until equilibrium conditions are substantially established, gradually reducing the temperature of the slice to room temperature at a rate of about 20° C. per minute to form an acceptor type regrowth region adjacent the surface of the slice of donor type silicon, removing any aluminum-silicon eutectic from the surface of the regrowth region with an etching solution, subjecting the resulting structure to a temperature of about 1200° C. for about an hour in an oxidizing atmosphere for diffusing aluminum from the regrowth region into the body of the slice of silicon, and depositing a layer of a conductor on each side of the silicon slice to form electrical contacts for the resulting diode.

5. A method of fabricating a semiconductor device which comprises the steps of depositing by evaporation-fusion at about 600° C. a layer of aluminum about 20 microns thick onto a surface of a slice of silicon crystal about 6 mils thick doped with about $5 \times 10^{17}$ atoms of antimony per cubic centimeter, subjecting the resulting structure to a temperature of about 670° C. until equilibrium conditions are substantially established, gradually reducing the temperature of the slice to room temperature at a rate of about 20° C. per minute to form an acceptor type regrowth region adjacent the surface of the slice of donor type silicon, removing any aluminum-silicon eutectic from the surface of the regrowth region with an etching solution, subjecting the resulting structure to a temperature of about 1200° C. for about 2 hours in an oxidizing atmosphere for diffusing aluminum from the regrowth region into the body of the slice of silicon, and depositing a layer of a conductor on each side of the silicon slice to form electrical contacts for the resulting diode.

References Cited in the file of this patent

UNITED STATES PATENTS

| | | |
|---|---|---|
| 2,753,281 | Scaff | July 3, 1956 |
| 2,789,068 | Maserjian | Apr. 16, 1957 |
| 2,819,990 | Fuller | Jan. 14, 1958 |
| 2,823,148 | Pankove | Feb. 11, 1958 |
| 2,835,615 | Leinfelder | May 20, 1958 |
| 2,854,366 | Wannlund et al. | Sept. 30, 1958 |
| 2,899,344 | Atalla et al. | Aug. 11, 1959 |

OTHER REFERENCES

Hansen: Constitution of Binary Alloys, 1958 (2nd ed.), page 133.